(12) United States Patent
Yang et al.

(10) Patent No.: US 9,680,134 B2
(45) Date of Patent: Jun. 13, 2017

(54) PACKAGING METHOD, PACKAGING STRUCTURE AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Feng Bai, Beijing (CN); Ruiyong Wang, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/785,643

(22) PCT Filed: Apr. 28, 2015

(86) PCT No.: PCT/CN2015/077671
§ 371 (c)(1),
(2) Date: Oct. 20, 2015

(87) PCT Pub. No.: WO2016/074445
PCT Pub. Date: May 19, 2016

(65) Prior Publication Data
US 2016/0351844 A1 Dec. 1, 2016

(30) Foreign Application Priority Data

Nov. 12, 2014 (CN) .......................... 2014 1 0645978

(51) Int. Cl.
*H01L 51/52* (2006.01)
*B32B 37/14* (2006.01)
(Continued)

(52) U.S. Cl.
CPC ........ *H01L 51/529* (2013.01); *H01L 51/5246* (2013.01); *H01L 51/5253* (2013.01);
(Continued)

(58) Field of Classification Search
CPC ... G02F 1/1339; H01L 21/50; H01L 51/5246; H01L 27/3276; H01L 23/10; H01L 2924/0002; H01L 27/3279; H01L 2924/00
(Continued)

(56) References Cited

U.S. PATENT DOCUMENTS

2010/0209154 A1* 8/2010 Kim .................. G03G 15/2053
399/333
2011/0241528 A1 10/2011 Choi
(Continued)

FOREIGN PATENT DOCUMENTS

CN 1742364 3/2006
CN 101106156 A 1/2008
(Continued)

OTHER PUBLICATIONS

Office Action from Chinese Patent Application No. 201410645978.3, dated Apr. 22, 2016.
(Continued)

*Primary Examiner* — Kimberly Rizkallah
*Assistant Examiner* — Brian Turner
(74) *Attorney, Agent, or Firm* — Westman, Champlin & Koehler, P.A.

(57) ABSTRACT

The present disclosure provides a packaging method, a packaging structure and a display device. The packaging method comprises forming a pattern of a packaging adhesive on a packaging area of a first substrate, and forming a heat dissipating structure on the packaging area of any of the first substrate and a second substrate; attaching the first substrate and the second substrate, and aligning the packaging area of
(Continued)

the first substrate with that of the second substrate; illuminating the pattern of the packaging adhesive by a laser beam to melt and frit it, so as to form a packaging adhesive structure between the first and second substrates. In the present invention, in the case that the heat dissipating structure is manufactured on the packaging area, when the packaging adhesive is illuminated by the laser beam to be melted, the heat dissipating structure can quickly dissipate the heat, effectively suppress the rapid increase of the substrate temperature caused by the laser illumination, and reduce the damage to the drive back plate.

6 Claims, 6 Drawing Sheets

(51) Int. Cl.
    *C03B 23/203*     (2006.01)
    *H01L 33/48*     (2010.01)
    *H01L 51/56*     (2006.01)
    *H01L 51/00*     (2006.01)

(52) U.S. Cl.
    CPC .......... *H01L 51/56* (2013.01); *H01L 51/0048* (2013.01); *H01L 2251/301* (2013.01)

(58) Field of Classification Search
    USPC ...... 257/40, 414, 99, 712, 750; 438/49, 610, 438/26
    See application file for complete search history.

(56) References Cited

U.S. PATENT DOCUMENTS

| | | | |
|---|---|---|---|
| 2011/0241541 A1 | 10/2011 | Liu et al. | |
| 2012/0287026 A1* | 11/2012 | Masuda | H01L 27/3272 345/76 |
| 2012/0319092 A1* | 12/2012 | Shimomura | B32B 37/06 257/40 |
| 2013/0049062 A1* | 2/2013 | Hatano | H01L 21/50 257/99 |
| 2013/0236753 A1* | 9/2013 | Yue | H01M 2/1077 429/62 |
| 2014/0087099 A1* | 3/2014 | Veerasamy | E06B 3/6775 428/34 |
| 2014/0125935 A1* | 5/2014 | Nakamura | G02F 1/1339 349/153 |
| 2014/0216645 A1* | 8/2014 | Nakamura | B32B 37/1292 156/272.8 |
| 2014/0231933 A1* | 8/2014 | Yu | G01N 27/128 257/414 |
| 2014/0284799 A1* | 9/2014 | Katagiri | H01L 23/53276 257/750 |

FOREIGN PATENT DOCUMENTS

| | | |
|---|---|---|
| CN | 101711438 A | 5/2010 |
| CN | 102754524 | 10/2012 |
| CN | 103367623 A | 10/2013 |
| CN | 104409663 A | 3/2015 |
| JP | 2009-038019 A | 2/2009 |
| KR | 10-071400 | 4/2007 |
| WO | WO 2009/108319 | 9/2009 |

OTHER PUBLICATIONS

International Search Report and Written Opinion for PCT Application No. PCT/CN2015/077671, dated Aug. 18, 2015, 9 pages.
English translation of Box No. V from the Written Opinion for PCT Application No. PCT/CN2015/077671, 2 pages.

* cited by examiner

PACKAGING METHOD, PACKAGING STRUCTURE AND DISPLAY DEVICE

CROSS-REFERENCE TO RELATED APPLICATION

This application is a Section 371 National Stage Application of International Application No. PCT/CN2015/077671, filed on 28 Apr. 2015, entitled "PACKAGING METHOD, PACKAGING STRUCTURE AND DISPLAY DEVICE", which claims the benefit of Chinese Patent Application No. 201410645978.3 filed on Nov. 12, 2014 with the State Intellectual Property Office of China, the whole disclosure of which is incorporated herein their reference.

BACKGROUND

Field of the Disclosure

The present disclosure relates to the technical field of display, and in particular, to a packaging method, a packaging structure and a display device.

Description of the Related Art

Luminescent material and functional material within an organic light-emitting diode (OLED) are relatively sensitive to water and gas, and thus requirements on sealing of oxygen and isolation of water are relatively strict. In order to prevent water vapor and oxygen from adversely affecting the OLED, currently small and medium sized OLED display devices are mostly packaged by a laser sealing process with a Frit material, that is, a laser beam is moved to heat a glass packaging adhesive, so that the glass packaging adhesive is melted. The melted glass packaging adhesive is used to form a hermetically sealed packaging connection between upper and lower glass substrates, thereby providing an airtight seal. However, transient temperature during the packaging process will reach several hundreds of degrees. Such high packing temperature will damage a back plate structure of a drive transistor within the OLED device, and degrade the lifetime of the device.

SUMMARY OF THE DISCLOSURE

The technical problem to be solved by the present invention is to provide a packaging method, a packaging structure and a display device, which can effectively suppress rapid increase of temperature of a substrate caused by laser illumination and reduce an damage to the drive back plate.

In order to solve this technical problem, an embodiment of the present invention provides a packaging method, comprising:

forming a pattern of a packaging adhesive on a packaging area of a first substrate, and forming a heat dissipating structure on the packaging area of any of the first substrate and a second substrate;

attaching the first substrate and the second substrate with each other, and aligning the packaging area of the first substrate with that of the second substrate;

illuminating the pattern of the packaging adhesive by a laser beam to melt and frit it, so as to form a packaging adhesive structure between the first and second substrates.

In order to solve this technical problem, the present invention provides a packaging structure, comprising a first substrate, a second substrate, and a packaging adhesive structure on a packaging area to seal the first and second substrates, wherein the packaging area is further provided with a heat dissipating structure provided between the first and second substrates.

In order to solve the above technical problem, the present invention also provides a display device comprising the above described packaging structure.

DETAILED DESCRIPTION OF THE PREFERRED EMBODIMENTS

Specific embodiments of the present invention will be described in detail in conjunction with the accompanying figures and examples. The following embodiments are used to illustrate the present invention, but not to limit the scope of the present invention.

Figure 1:
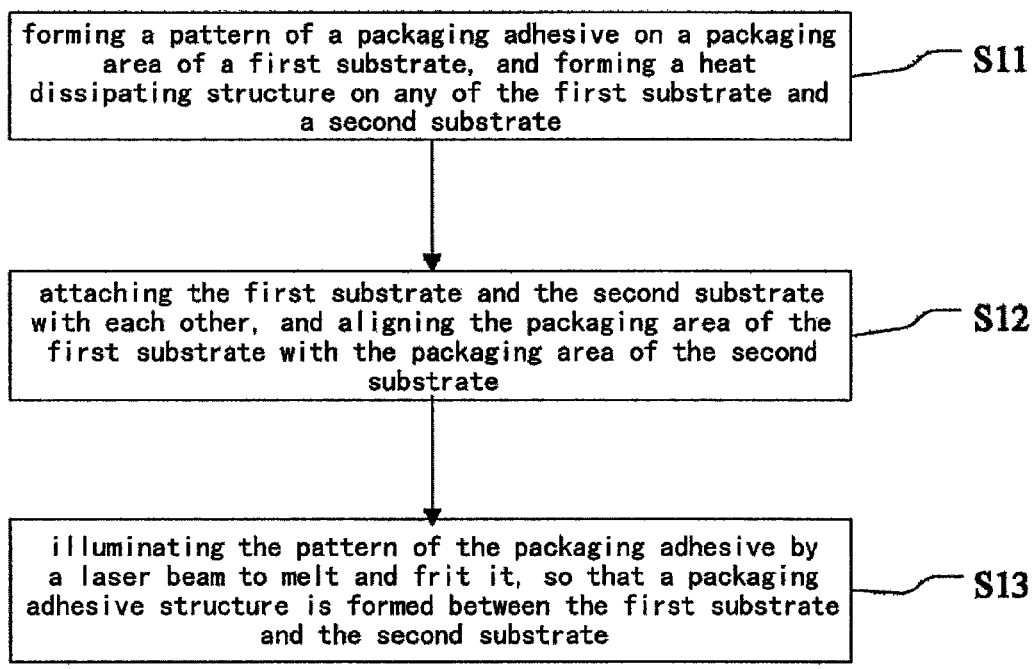
FIG. 1 is a flowchart of a packaging method according to an embodiment of the present invention.

FIG. 1 is a flowchart of a packaging method according to an embodiment of the present invention. The packaging method includes the steps of:

S11, forming a pattern of a packaging adhesive on a packaging area of a first substrate, and forming a heat dissipating structure on the packaging area of any of the first substrate and a second substrate;

S12, attaching the first substrate and the second substrate with each other, and aligning the packaging area of the first substrate with the packaging area of the second substrate;

S13, illuminating the pattern of the packaging adhesive by a laser beam to melt and frit it, so that a packaging adhesive structure is formed between the first substrate and the second substrate.

In the packaging method in accordance with the embodiment of the present invention, the heat dissipating structure is made on the packaging area. When the packaging adhesive is illuminated by the laser beam to be melted, the heat dissipating structure can rapidly dissipate the heat, effectively suppress the rapid increase of the substrate temperature caused by the laser illumination, and reduce the damage to the drive back plate.

The packaging method according to the embodiment of the present invention can be used to package, for example, OLEDs. The material by which the heat dissipating structure is made, can be metal materials or nano carbon materials.

Specifically, it is preferable to use a nano carbon layer formed on the packaging area of any of the first and second substrates, as the heat dissipating structure. The nano carbon layer can be made of carbon nanotubes or graphene materials. Preferably, in order to improve the heat dissipating effect, a plurality of nano carbon layers are used as the heat dissipating structure.

Preferably, in order to further improve the heat dissipating effect, a process of forming the nano carbon layer as the heat dissipating structure as described above can be added with a step of: doping the nano carbon layer with particles of metallic compound so as to form a doped layer. Specifically, the doping can be done by means of vacuum evaporation, in order to form the doped layer.

Further, particle diameters of the above metallic compound particles may be in a range of 10 nm to 50 nm, for example, 20 nm, 30 nm, or 40 nm. Particle materials of the metallic compound may be aluminum chloride or zinc iodide. The heat dissipating effect of the heat dissipating structure can be improved by 30%-40% by adding the doped layer formed of the metallic compound into the heat dissipating structure. As shown in Table 1, for example, the heat dissipating structure of number 8 has a composition of only two graphene layers, coefficient of heat transmission of which is 4180 W/m*K. When the aluminum chloride particles having a diameter of 10 nm are doped into the heat dissipating structure (taking the heat dissipating structure of number 1 as one example, it includes the doped layer composed of two graphene layers and one layer of aluminum chloride particles), the coefficient of heat transmission thereof can be up to 6000 W/m*K, thereby significantly improving the heat dissipating effect.

The second method is as follows:
obtaining a nano carbon film which has a shape matching that of the packaging area of the substrate;
forming a bonding area on the packaging area of the substrate; and
attaching the obtained nano carbon film to the bonding area.

Figure 2:
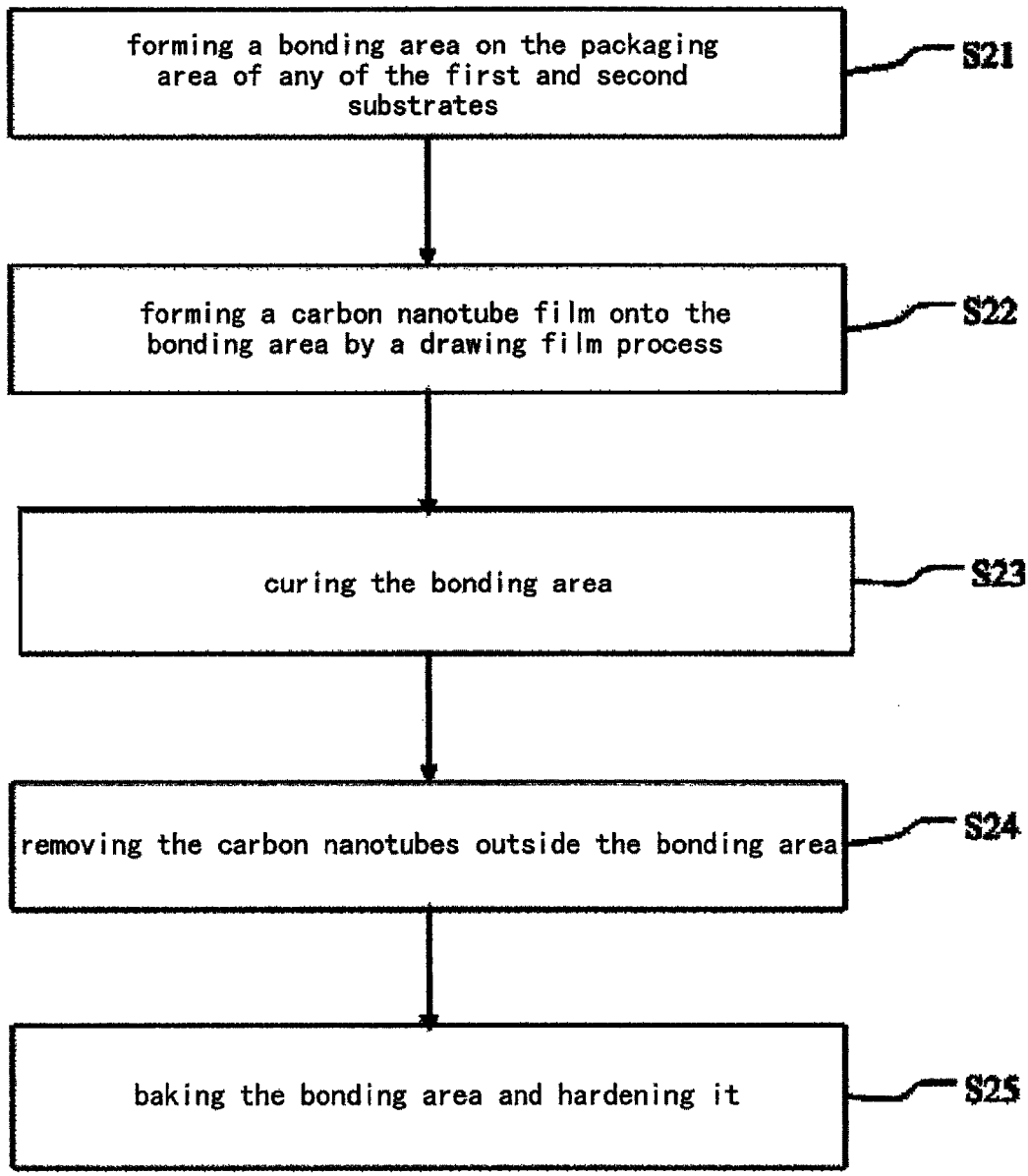
FIG. 2 is a flowchart of manufacturing a heat dissipating structure by carbon nanotubes materials according to an embodiment of the present invention.
Figure 3:
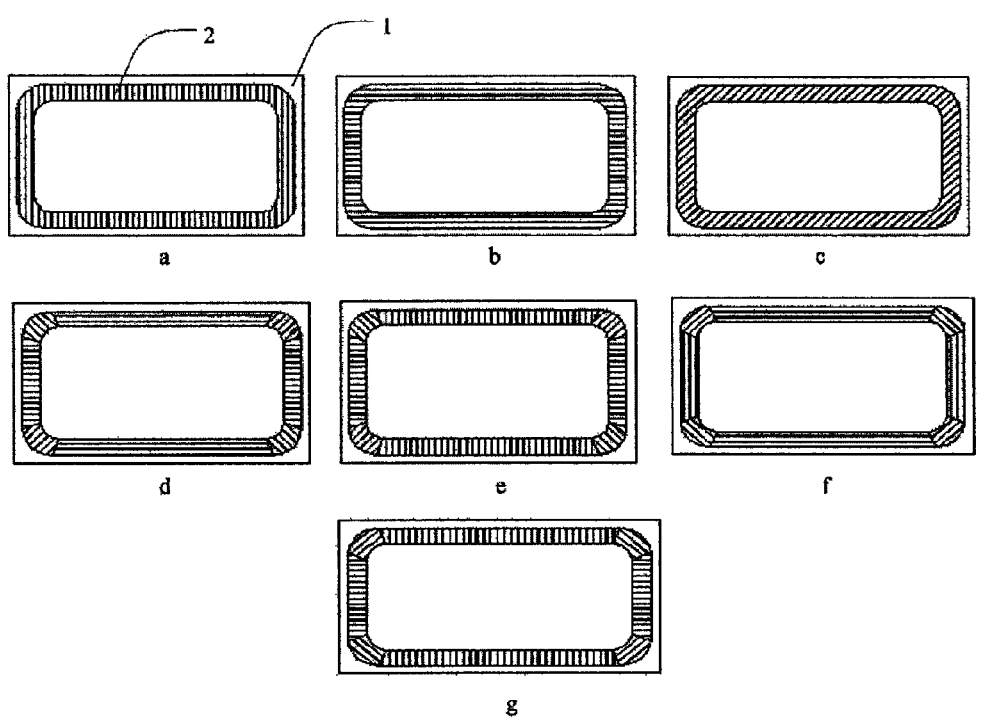
FIGS. 3a-3g are schematic views showing directions of drawing film of carbon nanotube films according to an embodiment of the present invention.

With reference to FIG. 2, it is a flowchart of manufacturing the heat dissipating structure by the carbon nanotube material in accordance with the first method as described above. It includes the steps of:

S21, forming a bonding area on the packaging area of any of the first and second substrates; for example, with respect to the OLED, the first substrate can be a cover plate, and the second substrate can be a BP substrate (TFT substrate). The bonding area can be formed by UV adhesive. Specifically, the UV adhesive may be firstly coated onto the BP substrate (TFT substrate); and the process of coating the UV adhesive may be the process such as printing, spin coating, slit coating, and spin&slit coating (the adhesive is coated firstly by the slit coating, and the coated adhesive becomes even and planarization by the spin coating); the substrate having the coated UV adhesive is pre-baked to volatilize a part of solvent and thus form the bonding area.

S22, forming a carbon nanotube film onto the bonding area by a drawing film process. Specifically, after the substrate is pre-baked, the carbon nanotubes are covered onto the area on which the UV adhesive is formed, and the covering structure of the carbon nanotubes can be formed by the drawing film process. Specifically, the covering structure of the carbon nanotubes can be formed by drawing film along different directions as shown in FIGS. 3a-3g. Within

TABLE 1

| composition | | | number | | | | | | | | | |
|---|---|---|---|---|---|---|---|---|---|---|---|---|
| | | | 1 | 2 | 3 | 4 | 5 | 6 | 7 | 8 | 9 | 10 |
| Doped material | aluminium chloride | Layer number | 1 | 1 | 1 | — | — | — | — | — | — | — |
| | | Particle diameters (nm) | 10 | 20 | 30 | — | — | — | — | — | — | — |
| | zinc iodide | Layer number | — | — | — | 1 | 1 | 1 | 1 | — | — | — |
| | | Particle diameters (nm) | — | — | — | 40 | 40 | 50 | 50 | — | — | — |
| Graphene (layer number) | | | 2 | 2 | 2 | — | 2 | — | 2 | 2 | — | 3 |
| Carbon nanotube (layer number) | | | — | — | — | 2 | — | 2 | — | — | 2 | — |
| Coefficient of heat transmission (W/m * K) | | | 6000 | 6050 | 6150 | 6100 | 6200 | 5980 | 6150 | 4180 | 4250 | 4400 |

Preferably, as for the heat dissipating structure composed of a plurality of nano carbon layers, the doped layer as described above can be formed between the nano carbon layers.

In one embodiment, the step of forming the nano carbon layers on any of the substrates includes:
forming a nano carbon layer onto the packaging area of any of the substrates, which has a shape matching that of the packaging area of that substrate. Specifically, the step of forming the nano carbon layer on the packaging area of the substrate can be done by two methods below.

The first method is as follows:
forming a bonding area on the packaging area of the substrate;
forming a nano carbon film on the bonding area and patterning the nano carbon film so that the nano carbon layer is formed onto the packaging area of the substrate, which has a shape matching that of the packaging area of the substrate.

FIGS. 3a-3g, dark lines marked on the carbon nanotube layer 2 indicate the direction of drawing film. For example, in FIG. 3a, the direction of drawing film is a direction of a short side of the BP substrate 1; while in FIG. 3b, the direction of drawing film is a direction of a long side of the BP substrate 1;

S23: curing the bonding area after the process of drawing film, i.e., performing a UV curing on the UV adhesive area formed with the carbon nanotube film;

S24: removing the carbon nanotubes outside the bonding area i.e., removing the carbon nanotubes outside the UV adhesive area, for example, by cleaning or blowing air;

S25: baking the bonding area and hardening it.

In the manufacturing method of the above heat dissipating structure, the UV adhesive is used to form the bonding area. However, the person skilled in the art can understand that the bonding area can be formed by other materials such as thermosetting resin or the like. In addition, if in the step S21 the thermosetting resin is used to form the bonding area, then in the step S23, the curing treatment is done by the thermosetting process.

For the OLED, the above heat dissipating structure can be formed on the BP substrate or the cover plate, preferably onto the BP substrate. In addition, in order to more significantly improve the heat dissipating effect under the premise of not affecting the packaging effect, in the packaging process the pattern of the packaging adhesive can have the same shape as that of the pattern of the heat dissipating structure and they are disposed to face each other.

Figure 4:
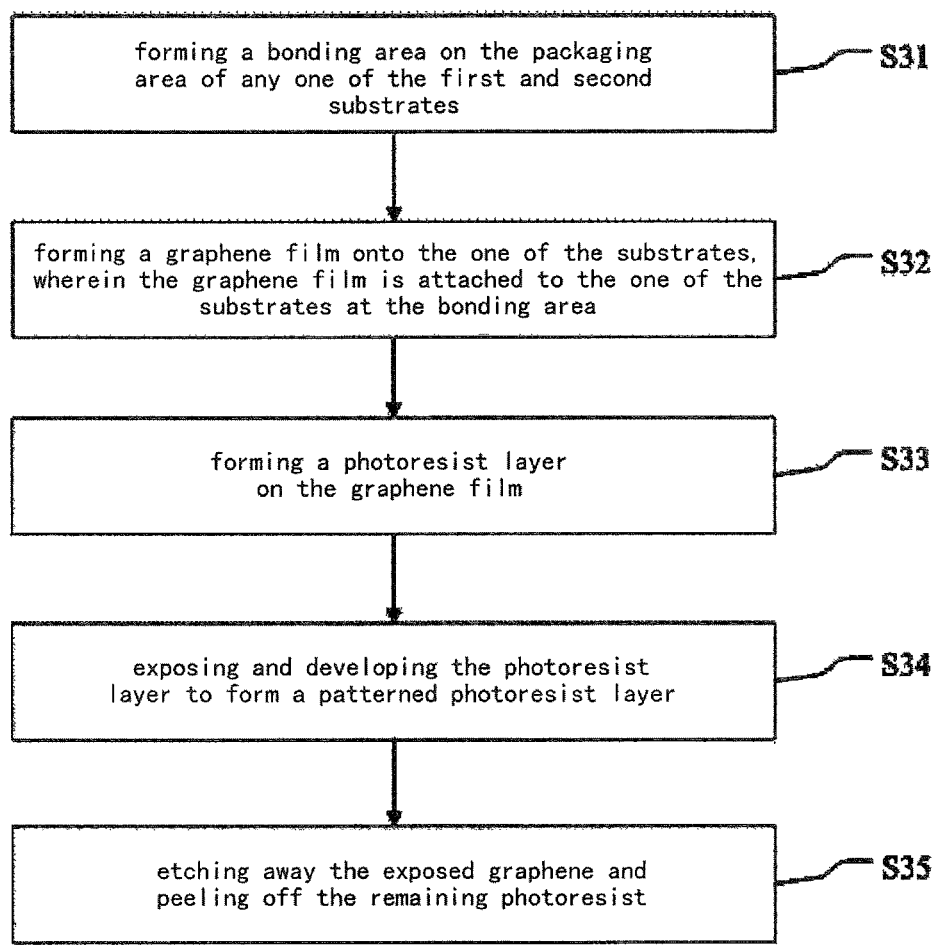
FIG. 4 is a flowchart of manufacturing a heat dissipating structure by graphene materials according to an embodiment of the present invention.

With reference to FIG. 4, it is a flowchart of making the heat dissipating structure by the graphene material in accordance with the first method as described above. It includes the steps of:

S31, forming a bonding area on the packaging area of any of the first and second substrates; for example, with respect to the OLED, the first substrate can be a cover plate, and the second substrate can be a BP substrate (TFT substrate). The thermosetting resin can be coated onto the packaging area of the BP substrate, and the process of coating the thermosetting resin can be the process such as printing, spin coating, slit coating, and spin&slit coating or the like.

Figure 5:
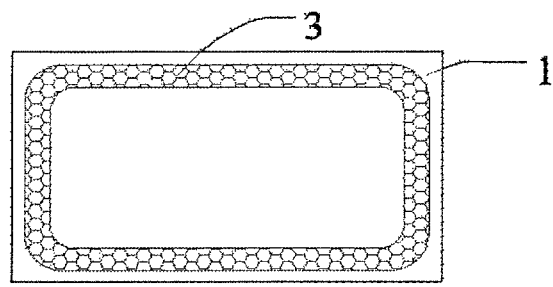
FIG. 5 is a schematic view of the heat dissipating structure formed by the graphene materials according to an embodiment of the present invention.

S32, forming a graphene film onto the one of the substrates, wherein the graphene film is attached to the BP substrate at the bonding area; and thermosetting the BP substrate after the attaching;

S33, forming a photoresist layer on the graphene film, for example, the UV adhesive can be coated onto the surface of the graphene film and is pre-baked to form the photoresist layer;

S34, exposing and developing the photoresist layer to form a patterned photoresist layer, and then post-baking and hardening the BP substrate;

S35, etching away the exposed graphene and peeling off the remaining photoresist, so as to form the heat dissipating structure; specifically, with reference to FIG. 5, the graphene film can be etched by an etching process and then the UV adhesive is peeled off and cleaned, so that the heat dissipating structure 3 is formed on the BP substrate 1.

Furthermore, the second method can be done by directly attaching the graphene film having a predetermined pattern and specification onto the BP substrate, that is, obtaining the patterned graphene layer in advance and then directly attaching the patterned graphene layer onto the bonding area.

Preferably, in order to prevent the above heat dissipating structure from affecting the packaging effect, vertical through holes are also formed within the heat dissipating structure. The through holes can be formed together with the step of manufacturing the nano carbon layer having the shape matching that of the packaging area, or can be formed onto the nano carbon layer after the step of manufacturing the nano carbon layer having the shape matching that of the packaging area. For example, the pattern of corresponding through holes can be formed again by a laser ashing process or a lithographic process onto the nano carbon layer having the shape matching that of the packaging area. The through holes can enhance the bonding between two side portions of the heat dissipating structure and reduce the influence of the heat dissipating structure on the subsequent packaging effect.

In the packaging method according to the embodiment of the present invention, in the case that the heat dissipating structure is formed on the packaging area, when the packaging adhesive is illuminated by the laser beam to be melted, the heat dissipating structure can quickly dissipate the heat, effectively suppress the rapid increase of the substrate temperature caused by the laser illumination, and reduce the damage to the drive back plate; meanwhile, laser sealing damage (LSD) will not be generated due to the introduction of the heat dissipating structure, and thus improving packaging yield of products. In addition, the use of nano carbon materials can bring about the advantages of low cost and simple processes. Because the nano carbon structure has large coefficient of heat conduction and good property of heat dissipating, it can further improve the heat dissipating effect.

Figure 6:
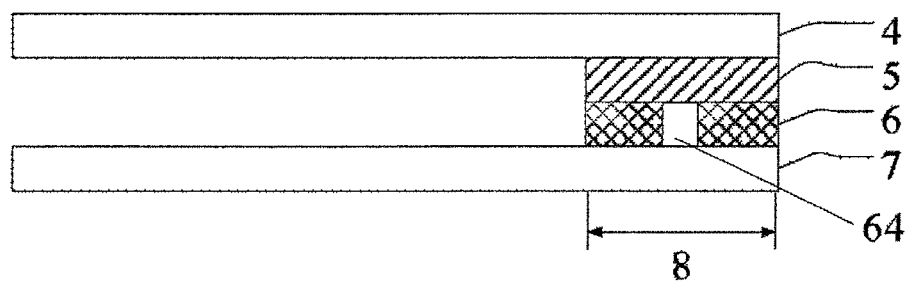
FIG. 6 is a schematic view of a packaging structure according to an embodiment of the present invention.

In addition, with reference to FIG. 6, the embodiment of the present invention also provides a packaging structure, which includes a first substrate 4, a second substrate 7 and a packaging adhesive structure 5 located at a packaging area 8 to seal the first and second substrates 4, 7. Further, the packaging area 8 is also provided with a heat dissipating structure 6 between the first substrate 4 and the second substrate 7. For example, with respect to the OLED, the first substrate can be a cover plate and the second substrate can be a BP substrate (TFT substrate). Preferably, in order to prevent the heat dissipating structure from affecting the packaging effect, the heat dissipating structure is also provided with vertical through holes 64.

Figure 7:
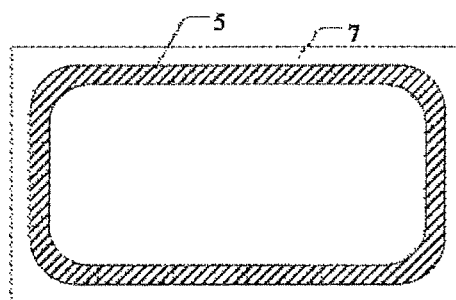
FIG. 7 is a schematic view of a packaging adhesive structure according to an embodiment of the present invention.
Figure 8:
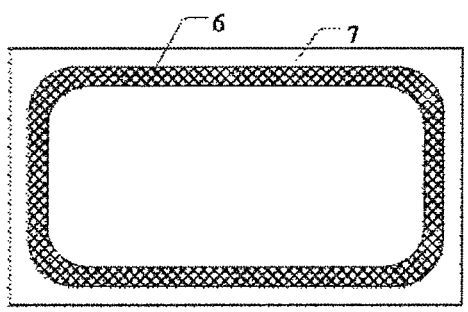
FIG. 8 is a schematic view of a heat dissipating structure according to an embodiment of the present invention.

Specifically, the packaging adhesive structure 5 can be a Frit material. Preferably, the heat dissipating structure is made of nano carbon materials, such as, carbon nanotube material, graphene material or the like. The packaging adhesive structure 5 has the shape as shown by FIG. 7. In order to more significantly improve the heat dissipating effect under the premise of not affecting the packaging effect, the pattern of the heat dissipating structure 6 can have the same shape as that of the pattern of the packaging adhesive structure 5, i.e., having the shape as shown in FIG. 8.

Figure 9:
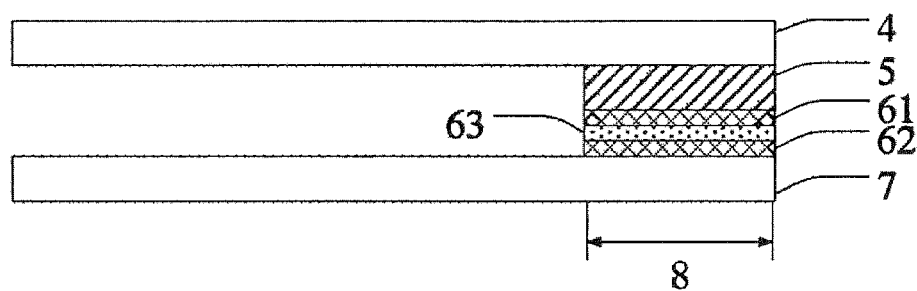
FIG. 9 is a schematic view of another packaging structure according to an embodiment of the present invention.

Preferably, the heat dissipating structure according to the embodiment of the present disclosure not only includes a nano carbon layer, but also includes a doped layer which is formed by doping the nano carbon layer with the metallic compound particles. For example, as shown in FIG. 9, the packaging structure includes a first substrate 4, a second substrate 7 and a packaging adhesive structure 5 located at a packaging area 8 to seal the first and second substrates 4, 7. Specifically, the packaging area 8 is also provided with a heat dissipating structure 6 between the first and second substrates 4, 7. The heat dissipating structure 6 includes a first nano carbon layer 61, a second nano carbon layer 62 and a doped layer 63 between the first and second nano carbon layers 61 and 62. The addition of the doped layer 63 into the heat dissipating structure can significantly improve the heat dissipating effect of the heat dissipating structure.

Specifically, a particle diameter of the metallic compound particle may be in a range of 10 nm to 50 nm, for example, 20 nm, 30 nm or 40 nm. The material of the metallic compound particle may be aluminum chloride or zinc iodide.

In addition, the present invention also provides a display device, including the above packaging structure. The display device according to the embodiments of the present disclosure can be any product or components having display function, such as a display screen of a notebook computer, a liquid crystal display, a liquid crystal TV, a digital photo frame, a mobile phone, or a flat computer.

The above embodiments are only intended to illustrate the present invention, rather than limiting the present invention. The ordinary skilled person in the relevant technical filed can make various changes and alternations without departing from the spirit and scope of the present invention. All the equivalent technical solutions should also be within the scope of the present invention, which is defined by the pending claims.

The invention claimed is:

1. A packaging method, comprising:

forming a pattern of a packaging adhesive on a packaging area of a first substrate, and forming a heat dissipating structure on the packaging area of any of the first substrate and a second substrate;

attaching the first substrate and the second substrate with each other, and aligning the packaging area of the first substrate with that of the second substrate;

illuminating the pattern of the packaging adhesive by a laser beam to melt and frit the packaging adhesive, so as to form a packaging adhesive structure between the first and second substrates;

wherein the step of forming a heat dissipating structure on the packaging area of any of the first substrate and a second substrate comprises:

forming a plurality of nano carbon layers on the packaging area of the one of the first substrate and the second substrate;

forming a doped layer by doping the nano carbon layers with metallic compound particles, and the doped layer is formed between the plurality of nano carbon layers.

2. The packaging method as claimed in claim 1, wherein particle diameters of the metallic compound particles are in a range of 10 nm-50 nm.

3. The packaging method as claimed in claim 1, wherein material of the metallic compound particles is aluminum chloride or zinc iodide.

4. The packaging method as claimed in claim 1, wherein the step of forming a nano carbon layer on the packaging area of the one substrate comprises:

forming a bonding area on the packaging area of the one substrates;

forming a carbon nanotube film on the bonding area by a drawing film process;

curing the bonding area;

removing the carbon nanotube outside the bonding area; and baking and hardening the bonding area.

5. The packaging method as claimed in claim 1, wherein the step of forming a nano carbon layer on the packaging area of the one substrate comprises:

forming a bonding area on the packaging area of the one substrate;

forming a graphene film onto the one of the substrates, wherein the graphene film is attached to the one of the substrates at the bonding area;

forming a photoresist layer on the graphene film;

exposing and developing the photoresist layer to form a patterned photoresist layer; and etching away the exposed graphene and then peeling off the remaining photoresist.

6. The packaging method as claimed in claim 1, wherein the heat dissipating structure is further formed with vertical through holes.

* * * * *